United States Patent [19]

Campbell et al.

[11] 4,048,580
[45] Sept. 13, 1977

[54] APPARATUS FOR DETECTING A STABLE MICROWAVE DISCRETE FREQUENCY

[75] Inventors: Richard A. Campbell, Concord; Richard A. Sparks, Bedford; Robert W. Perry, Holliston, all of Mass.

[73] Assignee: The United States of America as represented by the Secretary of the Army, Washington, D.C.

[21] Appl. No.: 733,629

[22] Filed: Oct. 18, 1976

[51] Int. Cl.² ............................................. H03B 3/04
[52] U.S. Cl. .................................. 331/1 R; 328/140; 331/9; 331/69
[58] Field of Search .................... 331/1 R, 9, 25, 69; 307/233 R; 328/133, 134, 140; 329/116, 137, 145; 333/31 R, 31 C

[56] References Cited

U.S. PATENT DOCUMENTS

| 3,209,286 | 9/1965 | Eveleth | 333/30 R |
| 3,287,656 | 11/1966 | Fleming | 331/9 X |
| 3,287,658 | 11/1966 | Sulzer | 331/69 |
| 3,320,540 | 5/1967 | Ogi et al. | 329/145 X |
| 3,392,337 | 7/1968 | Neuburger | 328/140 X |
| 3,852,681 | 12/1974 | Underhill | 331/1 R |

Primary Examiner—Siegfried H. Grimm
Attorney, Agent, or Firm—Nathan Edelberg; Robert P. Gibson; Freddie M. Bush

[57] ABSTRACT

An input signal, whose frequency is to be detected, is divided and sent into two arms. One arm applies a set phase and amplitude adjustment while the other arm has a phase response that is dependent upon the frequency. Both arms are fed to a phase detector whose output is used to indicate the frequency of the input.

2 Claims, 2 Drawing Figures

APPARATUS FOR DETECTING A STABLE MICROWAVE DISCRETE FREQUENCY

DEDICATORY CLAUSE

The invention described herein was made under a contract with the Government and may be manufactured, used, and licensed by or for the Government for governmental purposes without the payment to us of any royalties thereon.

DESCRIPTION OF THE PREFERRED EMBODIMENT

Figure 1:
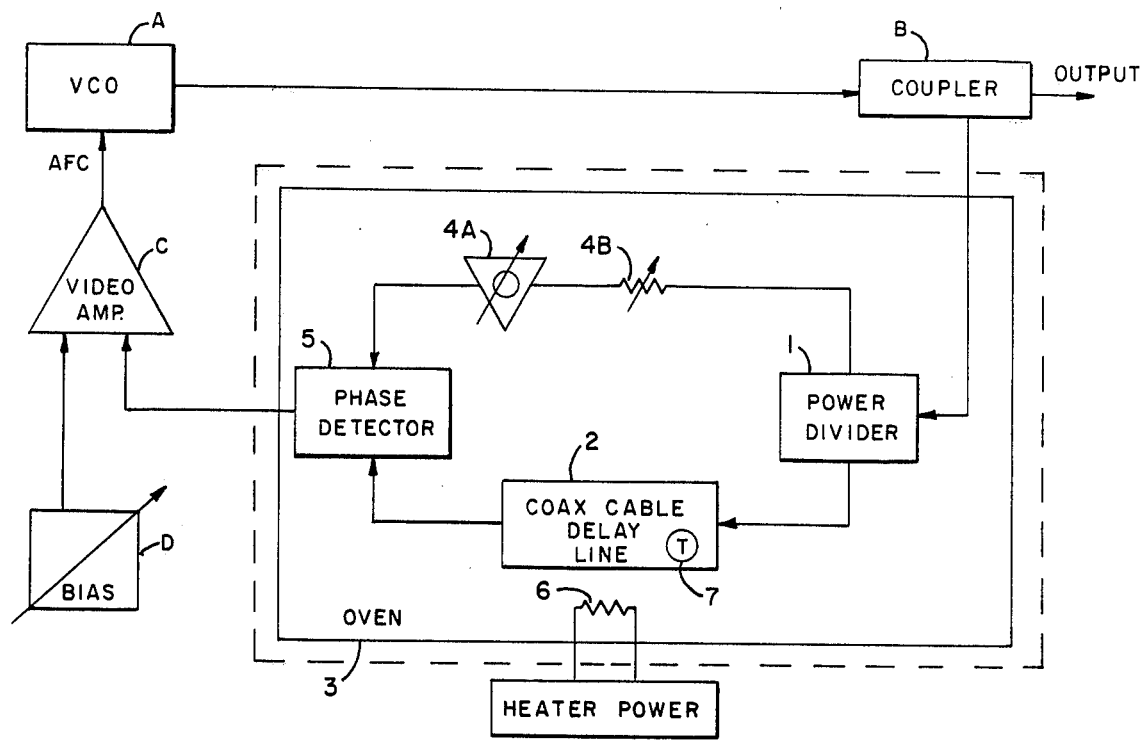
FIG. 1 is a block diagram illustrating the basic embodiment of the present invention.

The block diagram of FIG. 1 shows the Stable Microwave Discrete Frequency Reference circuit within the dashed line as a part of a microwave oscillator system. The power divider 1 divides the input signal between the two arms of the interferometer. The controlling element is the delay line 2, described further below. The elements in the other arm are phase 4A and amplitude 4B adjustments for alignment and compensation. The output is generated by the phase detector 5, which produces an output voltage which is proportional to the relative phase between its two inputs.

The delay line 2 is a coaxial cable delay line. For optimum thermal performance a "phase stable" coaxial cable is used. The electrical length of the cable is chosen on the basis of the required periodicity of the frequency reference and on the minimum required interferometer sensitivity. The phase stable delay line 2 is layer wound in an oval configuration, and then wrapped with aluminum tape to enhance heat conduction between layers.

The entire microwave interferometer is then mounted in a temperature controlled oven 3 that maintains a constant ($\pm 1°$ C) delay line temperature by means of a thermal sensor 7 mounted within the delay line coil which controls the current supplied to the heater 6 which is in intimate contact with the delay line itself. Connection and control circuit, not shown, can take the shape of any of the known control circuits.

In the application illustrated, a voltage controlled oscillator A generates a microwave signal, a portion of which is extracted for the Reference by the directional coupler B. The output of the Reference is amplified by a video amplifier C of appropriate gain and bandwidth, and its output is the AFC (automatic frequency control) voltage that controls the frequency of the oscillator.

Figure 2:
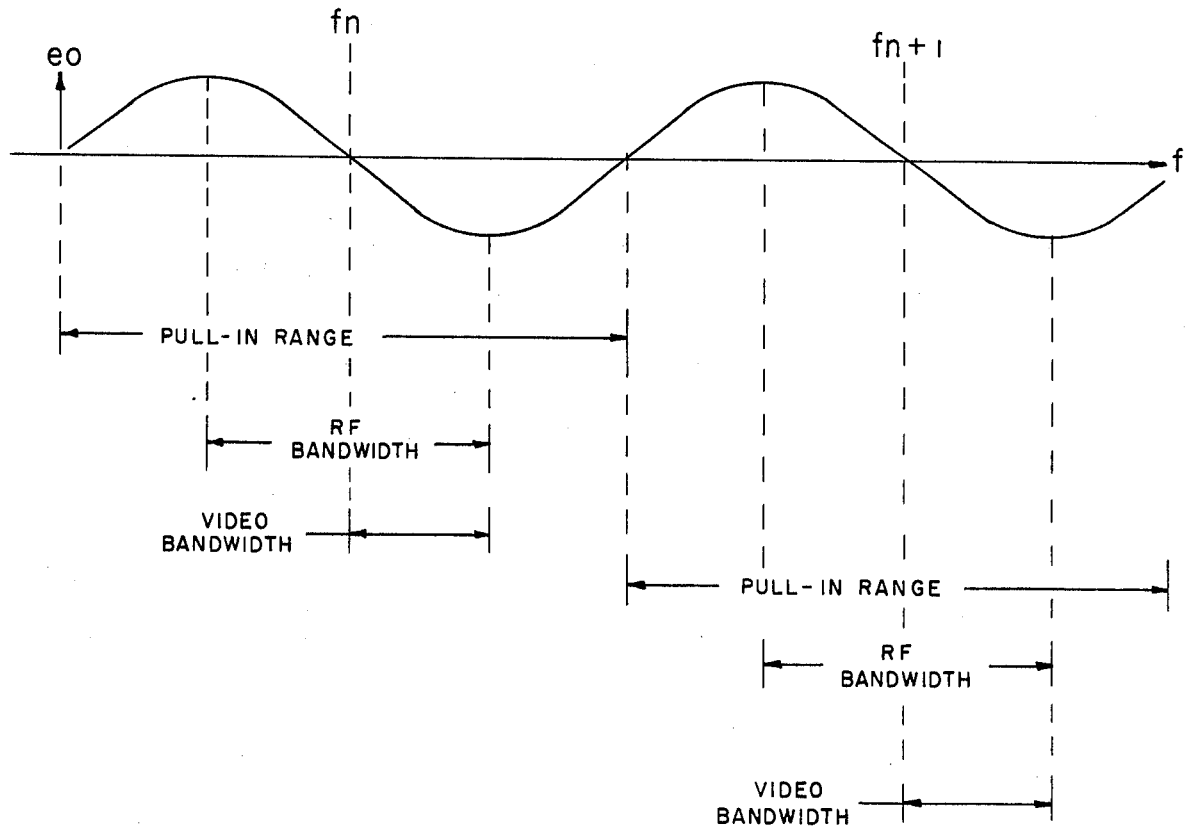
FIG. 2 is a graph showing the response of the system.

Adjusting the bias voltage D to be within the pull in range of one of the zero crossings of the frequency reference, such as $fn$ in FIG. 2, will result in low noise stable operation at $fn$. Opening the loop between the video amplifier C and the oscillator A and readjusting the bias D to be within the pull in range of $fn + 1$, will result in low noise stable operation at $fn + 1$ when the loop is reclosed. The multiplicity of the Reference (and therefore, of the oscillator in the illustrative example) is due to the periodicity of the output voltage of the Reference with frequency.

In operation the power divider 1 divides the input signal and sends one portion through the upper loop where it is changed in phase and amplitude by a set amount regardless of the frequency input, while the portion of the input signal going through the bottom loop is shifted in phase by an amount proportional to the frequency of the input signal. In this way the amount of phase difference detected by phase detector 5 is proportional to the frequency input. The output of phase detector 5 is sent to amplifier C which may be a differential amplifier. Differential amplifier C compares the amount of bias D input with the output of phase detector 5 and then applies an output which will adjust the voltage control oscillator A to bring frequency back into line by the desired amount if it has drifted. The desired output frequency of voltage control oscillator A can be adjusted by adjusting bias D.

The use of quality coaxial transmission lines and components in the present invention yields a more uniform series of frequencies (zero crossings) than other transmission schemes (waveguides, etc.). The use of the phase stable cable, with its low (1-2 ppm/° F) temperature coefficient, along with the use of the oven, yields a degree of long term frequency accuracy that has never been realized before.

The primary application of this interferometer is shown in FIG. 1. The primary application of this discrete frequency reference is in the generation of stable, low noise microwave signals for radar use, wherein many separate frequencies are needed. It is also conceivable that some test equipments, particularly computer operated, automatic test set-ups, could use this as a signal source to do rapid, but accurate, measurements over a microwave band of frequencies. It is even useful as a technique in a fixed frequency application, if a source with degeneration of its FM noise is desired, but the microphony of a microwave cavity discriminator is not desirable. In this sense, the interferometer can compete with the other forms of frequency discriminators (i.e., using cavities) if the criteria is low microphonism and low thermal coefficients. Its big advantage, however, is the multiplicity of response frequencies, which allows changing frequencies without mechanical motion or precision magnetic fields.

We claim:

1. A system comprising a source of AC voltage; a power divider having an input and two outputs; said source of AC voltage being connected to the input of said power divider; a phase detector having first and second inputs and an output; first coupling means coupling the first output of said power divider to the first input of said phase detector, said first coupling means being a series connected variable phase shifter and variable attenuator for providing signal alignment and compensation, and being phase insensitive to the frequency of said AC voltage; second coupling means connecting the second output of said power divider to the second input of said phase detector, said second coupling means being a phase stable coaxial cable having an electrical length determined by the periodicity of the frequency reference and the interferometer sensitivity, and having a phase variance in accordance with the variance of the frequency of said source of AC voltage; and an oven means for controlling the ambient temperature; said phase detector, power divider, first coupling means, and second coupling means being inclosed in said oven means.

2. A system as set forth in claim 1 further comprising an amplifier means having first and second inputs and an output; said output of said phase detector being connected to said first input of said amplifier; an adjustable bias means having an output connected to said second input of said amplifier means; a voltage control oscillator being the source producing said AC voltage and having a controlled input; and said output of said amplifier means being connected to the control input of said voltage control oscillator so as to control the frequency output of said oscillator.

* * * * *